(12) United States Patent
Tanokuchi et al.

(10) Patent No.: US 12,738,447 B2
(45) Date of Patent: Sep. 15, 2026

(54) VACUUM PROCESSING DEVICE

(71) Applicant: Hitachi High-Tech Corporation, Tokyo (JP)

(72) Inventors: Akito Tanokuchi, Tokyo (JP); Hiroki Tsubouchi, Tokyo (JP); Hiroyuki Andou, Tokyo (JP); Takao Ubukata, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 297 days.

(21) Appl. No.: 18/723,514

(22) PCT Filed: Feb. 18, 2022

(86) PCT No.: PCT/JP2022/006618
§ 371 (c)(1),
(2) Date: Jun. 24, 2024

(87) PCT Pub. No.: WO2023/157226
PCT Pub. Date: Aug. 24, 2023

(65) Prior Publication Data

US 2025/0054724 A1 Feb. 13, 2025

(51) Int. Cl.
*H01J 37/18* (2006.01)
*H01J 37/20* (2006.01)
*H01J 37/285* (2006.01)

(52) U.S. Cl.
CPC .............. *H01J 37/18* (2013.01); *H01J 37/20* (2013.01); *H01J 37/285* (2013.01); *H01J 2237/006* (2013.01); *H01J 2237/186* (2013.01)

(58) Field of Classification Search
None
See application file for complete search history.

(56) References Cited

U.S. PATENT DOCUMENTS

2002/0109090 A1* 8/2002 Nakasuji ............... H01J 37/073 250/311
2003/0042417 A1* 3/2003 Nakasuji ............... H01J 37/265 250/310

(Continued)

FOREIGN PATENT DOCUMENTS

JP 2004-206662 A 7/2004
JP 2006-55731 A 3/2006

(Continued)

OTHER PUBLICATIONS

International Search Report (PCT/ISA/210) issued in PCT Application No. PCT/JP2022/006618 dated May 17, 2022 with English translation (4 pages).

(Continued)

*Primary Examiner* — Umashankar Venkatesan
(74) *Attorney, Agent, or Firm* — Crowell & Moring LLP

(57) ABSTRACT

The purpose of the present disclosure is to provide a vacuum processing device that switches the rate of pressure variation depending on, e.g., the type of an object to be inspected, thereby making it possible to ensure operation reliability during inspection of a fragile object to be inspected, while preventing a decrease in throughput. The vacuum processing device according to the present disclosure comprises a preliminary exhaust chamber for the transfer of a sample between a sample chamber and the external air. The conductance of a pipe for ventilating the preliminary exhaust chamber is varied in accordance with a parameter corresponding to the fragility of a shape pattern formed on the sample (see FIG. 5).

10 Claims, 18 Drawing Sheets

(56) References Cited

U.S. PATENT DOCUMENTS

| | | | | |
|---|---|---|---|---|
| 2005/0189074 | A1 | 9/2005 | Kasai et al. | |
| 2008/0318442 | A1* | 12/2008 | Ogawa | C23C 16/40 438/785 |
| 2012/0144938 | A1* | 6/2012 | Inagaki | H10P 72/0402 73/865.8 |
| 2015/0040970 | A1* | 2/2015 | Garabedian | C23C 14/243 438/94 |

FOREIGN PATENT DOCUMENTS

| | | | |
|---|---|---|---|
| JP | 2006-156769 | A | 6/2006 |
| JP | 2007-127032 | A | 5/2007 |
| JP | 2009-62604 | A | 3/2009 |
| JP | 2011-75351 | A | 4/2011 |
| JP | 2013-197312 | A | 9/2013 |

OTHER PUBLICATIONS

Japanese-language Written Opinion (PCT/ISA/237) issued in PCT Application No. PCT/JP2022/006618 dated May 17, 2022 with English translation (6 pages).

* cited by examiner

VACUUM PROCESSING DEVICE

TECHNICAL FIELD

The present disclosure relates to a vacuum processing apparatus.

BACKGROUND ART

In a device manufacturing line, an apparatus to which a scanning electron microscope is applied is used for dimension measurement and defect inspection of a fine pattern formed on a silicon wafer (hereinafter, referred to as a wafer). For example, a critical dimension scanning electron microscope (CD-SEM) is used when dimensions of a gate and a contact hole of a semiconductor device are measured, and a defect inspection SEM or the like is used when a defect is inspected.

A chamber of the CD-SEM has an arrangement in which a load lock chamber (hereinafter, referred to as "LC"), which serves as a front chamber when bringing a wafer to be inspected into an apparatus from outside of the apparatus, and a main chamber (hereinafter, referred to as "SC"), which inspects the wafer by irradiating the wafer with an electron beam, are connected. An electron optical system is provided in the SC, and inspects the wafer by irradiating the wafer with an electron beam in the SC. In a normal use state, it is necessary to keep the inside of the SC in a high vacuum state in order to emit the electron beam. The SC includes a vacuum exhaust system. On the other hand, since the LC serves as the front chamber when the wafer is transferred between outside the apparatus and the SC, it is necessary to vary a pressure inside the chamber between an atmospheric pressure and high vacuum each time the wafer is taken in or the wafer is taken out after inspection. Therefore, the LC includes a system that performs vacuum exhaust and leak. A configuration including a vacuum exhaust system and a leak system in a chamber that serves as the front chamber such as the LC is not limited to the CD-SEM, and a vacuum processing apparatus is widely adopted.

When the vacuum exhaust and the leak in the LC are performed in accordance with a capacity of a vacuum exhaust pump or gas leak equipment, a fluctuation speed of an LC internal pressure immediately after the start and an airflow speed accompanying the fluctuation speed increase. If a foreign matter is accidentally accumulated in the LC, the foreign matter may be wound up and adhere to the wafer, causing a problem.

Patent Literature 1 discloses an example of an optical vacuum deposition apparatus to which a vacuum exhaust system and a leak system for converging two flow paths with different conductances are applied to one ventilation port communicating with the LC. Many vacuum processing apparatuses, including the CD-SEM, dislike a foreign matter being wound up. The apparatus described in Patent Literature 1 can reduce the fluctuation speed of the LC internal pressure immediately after the start of the vacuum exhaust and the leak. Although there is no variation in which the fluctuation speed is variously changed in the technique described in the document, such a vacuum exhaust system and a leak system are not limited to the optical vacuum deposition apparatus, and are widely used in the CD-SEM.

Patent Literature 2 discloses a technique related to an etcher apparatus that prevents occurrence of cross contamination by reducing a pressure difference between a plurality of adjacent chambers by a conductance valve capable of freely adjusting conductance.

CITATION LIST

Patent Literature

Patent Literature 1: JP2006-055731A
Patent Literature 2: JP2009-062604A

SUMMARY OF INVENTION

Technical Problem

In recent years, a pattern of the wafer, which is an inspection target of the CD-SEM, is increasingly fragile as compared with a pattern in the related art due to increasing miniaturization of the wafer year by year and the fact that the wafer is long and narrow in a surface direction of the wafer and has a high aspect ratio. As a result, there is an example in which an airflow speed due to a pressure fluctuation speed is too high and the pattern is broken when leak and coarse evacuation methods in the related art for the purpose of preventing wind-up of a foreign matter are used.

The coarse evacuation and leak systems disclosed in Patent Literature 1 do not assume that the pressure fluctuation speed is switched according to a type of wafer, and only one pattern of operation mode is provided for the purpose of preventing the wind-up of the foreign matter. In Patent Literature 1, it is possible to prevent pattern breakage by switching the purpose of the system from preventing the wind-up of the foreign matter to preventing pattern breakage, and by further reducing the pressure fluctuation speed than in the systems in the related art for the purpose of preventing the foreign matter. However, in this case, the number of wafers that can be inspected per unit time (=throughput) decreases when inspecting wafers whose patterns are not fragile.

In the technique described in Patent Literature 2, the pressure fluctuation speed in the vicinity of a desired ultimate pressure is set to 0 or close to zero, and the pressure fluctuation speed is not controlled until the desired ultimate pressure is reached. In addition, the technique described in the Patent Literature 2 does not switch the pressure fluctuation speed according to a type of inspection target such as a type of wafer. Therefore, according to the technique described in Patent Literature 2, it is difficult to prevent the pattern breakage of the wafer.

Although Patent Literatures 1 and 2 are described above as an example, there is no technique found in a vacuum processing apparatus including the CD-SEM that switches the pressure fluctuation speed depending on a wafer to be inspected until a desired ultimate pressure is reached.

An object of the present disclosure is to provide a vacuum processing apparatus that switches a pressure fluctuation speed depending on, for example, a type of object to be inspected, thereby making it possible to secure operation reliability during inspection of a fragile object to be inspected while preventing a decrease in throughput.

Solution to Problem

The vacuum processing apparatus according to the present disclosure includes: a preliminary exhaust chamber that transfers a sample between a sample chamber and an outside air. A conductance of a pipe that ventilates the preliminary exhaust chamber is changed according to a parameter corresponding to fragility of a shape pattern formed on the sample.

Advantageous Effects of Invention

According to the vacuum processing apparatus according to the present disclosure, it is possible to secure operation reliability during inspection of a fragile object to be inspected while preventing a decrease in throughput. Other problems, configurations, advantages, and the like of the present disclosure become apparent from the following description of embodiments.

DESCRIPTION OF EMBODIMENTS

Embodiment 1

Figure 1:
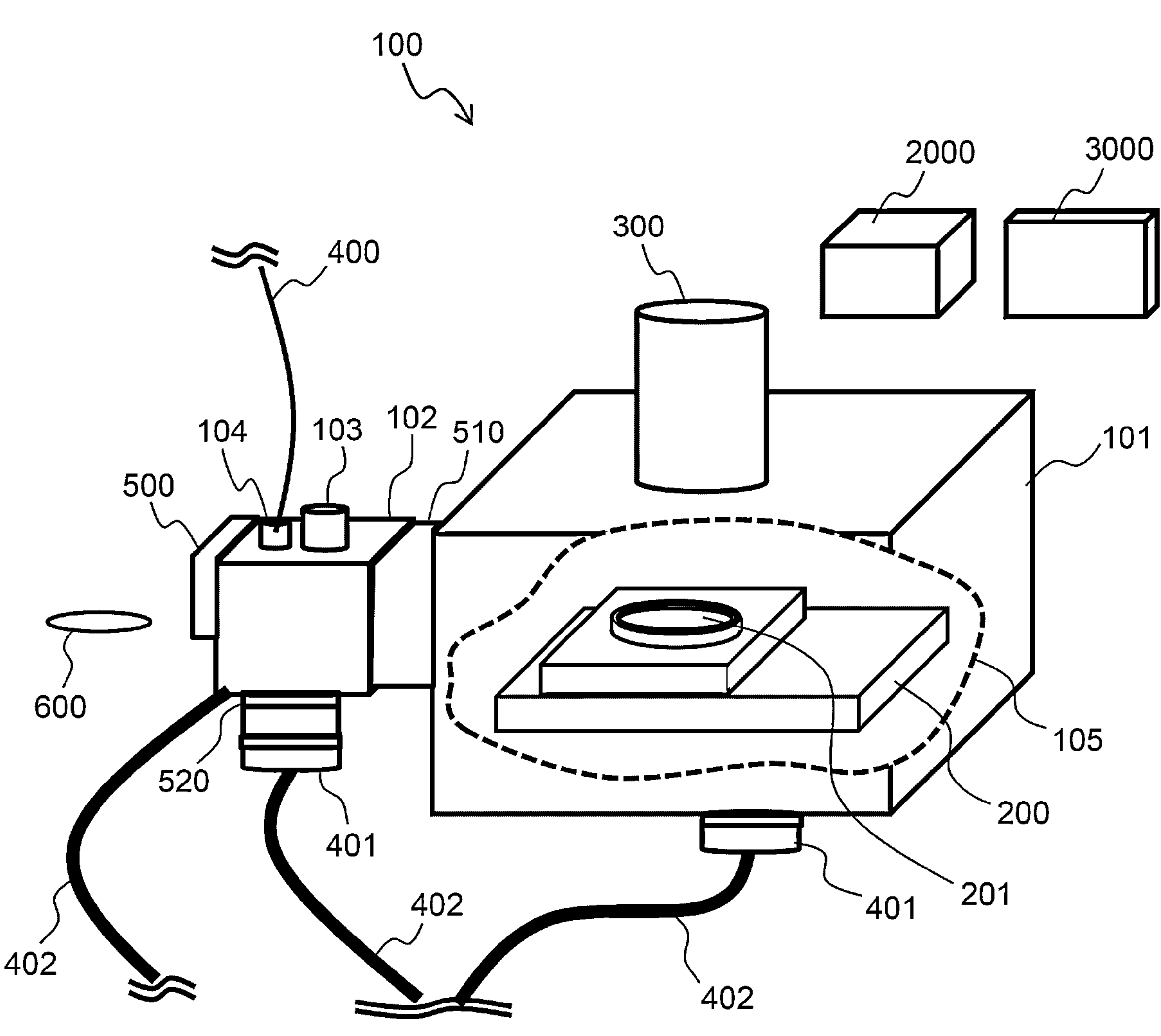
FIG. 1 is a diagram showing a schematic configuration of a general CD-SEM.

FIG. 1 is a diagram showing a schematic configuration of a general CD-SEM. A CD-SEM 100 has an arrangement in which two chambers, that is, the LC 102, which serves as a front chamber for taking the wafer 600 to be inspected into and out of an apparatus from outside the apparatus, and an SC 101, which performs the inspection of the wafer 600, are connected. A broken line 105 is a notch provided for convenience to show the inside of the SC 101.

The SC 101 includes a multiaxial stage 200 and an electron optical system 300. The multiaxial stage 200 includes a holding mechanism 201 that holds the wafer 600 using an electrostatic force or the like. The multiaxial stage 200 can move the wafer 600 in a plurality of directions. The electron optical system 300 irradiates the wafer 600 with an electron beam. The inspection of the wafer 600 is performed by the electron optical system 300 irradiating the wafer 600 with the electron beam after the multiaxial stage 200 holding the wafer 600 in the SC 101 by the holding mechanism 201 is positioned with respect to the electron optical system 300. In a normal use state, the SC 101 needs to keep an internal pressure in a high vacuum state in order to emit the electron beam.

Since the LC 102 serves as a front chamber when the wafer 600 is transferred between the outside of the apparatus and the SC 101, each time the wafer 600 is taken in or the wafer 600 is taken out after the inspection, it is necessary to vary the internal pressure between an atmospheric pressure and high vacuum. However, there is no single vacuum pump capable of performing vacuum exhaust in a range of the atmospheric pressure to the high vacuum. In this case, the LC 102 performs evacuation from an atmosphere region to a low vacuum region by using a pipe 402 connecting the LC 102 and a dry pump (not shown), and performs evacuation from the low vacuum region to a high vacuum region using a turbo-molecular pump (TMP) 401 and a pipe 402 connected thereto. The evacuation performed by the dry pump (not shown) is referred to as coarse evacuation, and the evacuation performed by the TMP 401 is referred to as regular evacuation. The LC 102 further includes a leak device 104 that ejects a gas such as dry nitrogen in order to return the inside of the LC to the atmospheric pressure. The leak device 104 is connected to leak equipment (not shown) via a leak pipe 400.

Meanwhile, since the SC 101 only needs to maintain the high vacuum state, only the evacuation from the low vacuum region to the high vacuum region is performed using the TMP 401 and the pipe 402 connected thereto. In addition to the above, the CD-SEM 100 includes the computer system 2000, an input and output device 3000, a pressure gauge 103 that measures the internal pressure of the LC 102, an apparatus inner-outer gate valve 500 that is provided at an opening between the LC 102 and the outside of the apparatus, an LC-SC gate valve 510 that is provided in an opening between the LC 102 and the SC 101, a TMP valve 520 that is provided between the LC 102 and the TMP 401, and other valves that are not shown in FIG. 1.

Figure 2:
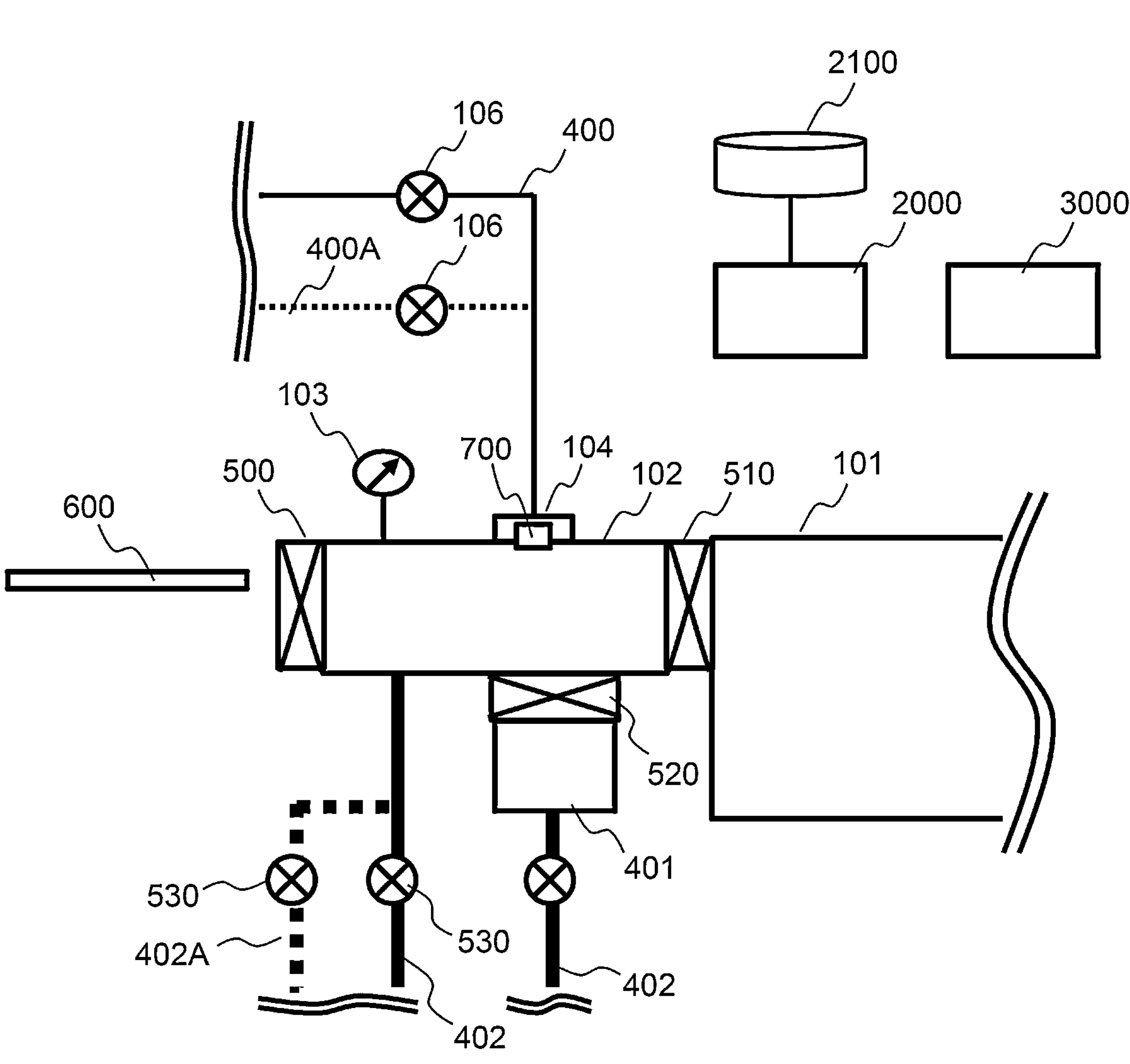
FIG. 2 is a schematic view of a vacuum exhaust system and a leak system of an LC 102 in a normal CD-SEM.

FIG. 2 is a schematic view of a vacuum exhaust system and a leak system of the LC 102 in a normal CD-SEM. For convenience of description, components inside and outside the apparatus are schematically shown without distinction. The vacuum exhaust and the leak performed accompanying the inspection will be described below.

In an initial state, the apparatus inner-outer gate valve 500, the LC-SC gate valve 510, the TMP valve 520, two pipe valves 530, and two leak valves 106 are all closed, and the inside of the LC 102 is set to the atmospheric pressure.

First, the wafer 600 is taken into the LC 102. This stage is completed by opening the apparatus inner-outer gate valve 500, taking the wafer 600 into an apparatus inside-outside transfer device (not shown), and placing the wafer 600 on a wafer holding portion (not shown) in the LC 102.

Subsequently, the LC 102 is evacuated from the atmospheric pressure. At this stage, the apparatus inner-outer gate valve 500 is closed to enclose the wafer 600. At this time, the inside of the LC 102 is at the atmospheric pressure. Thereafter, by opening the pipe valves 530 provided in each of a pipe 402A with poor conductance, and the pipes 402, which communicate with the LC 102 and a dry pump (not shown), in the stated order with a slight time difference, the LC 102 is subjected to the coarse evacuation from the atmosphere region to the low vacuum region. When the coarse evacuation is performed in accordance with an exhaust capacity of the dry pump, particularly when a fluctuation speed of an LC internal pressure immediately after the start of the coarse evacuation and an airflow speed accompanying the fluctuation speed are increased, and a foreign matter is accidentally accumulated in the LC, the foreign matter may be wound up and adhere to the wafer, causing a problem. The reason for performing the above-described coarse evacuation is that, at the start of the coarse evacuation, by exhausting from the pipe 402A with poor conductance, the airflow speed accompanying the pressure fluctuation is reduced to prevent the foreign matter from being wound up, whereas if this continues, a time required to complete the coarse evacuation increases, and therefore, by adding exhaust air from the pipes 402 with a normal conductance from the middle, an increase in time is reduced. If the pressure fluctuation speed at the start of the coarse evacuation is made too slow, the time required to complete the coarse evacuation increases, and thus the speed is generally set as quickly as possible within a range that does not cause a foreign matter to be wound up.

Subsequently, the LC 102 is evacuated from a low vacuum region to a high vacuum region. When the pressure gauge 103 detects that the internal pressure of the LC 102 reaches a TMP exhaust start pressure due to the coarse evacuation, the two pipe valves 530 are closed, and then the TMP valve 520 is opened to perform the regular evacuation using the TMP 401.

Subsequently, the wafer 600 is transferred from the LC 102 to the SC 101 and inspected. At this stage, the LC-SC gate valve 510 is opened when the pressure gauge 103 detects that the internal pressure of the LC 102 reaches a pressure (=high vacuum) at which the wafer can be transferred to the SC 101. Through this, the wafer 600 is transferred to the SC 101, which is in the high vacuum state in advance, by an LC-SC transfer device (not shown). Thereafter, the wafer 600 is irradiated with an electron beam in the SC 101 and inspected. Inspection contents vary depending on the type of the wafer 600. The CD-SEM 100 automatically switches the inspection contents according to the type and performs the inspection. The switching of the inspection contents will be described later.

Subsequently, the wafer 600 is transferred from the SC 101 to the LC 102. At this stage, since both the SC 101 and the LC 102 are in the high vacuum, and the LC-SC gate valve 510 is opened, the wafer 600 is transferred to the LC 102 by an LC-SC transfer device (not shown) through this, and the wafer 600 is placed in the wafer holding portion (not shown) in the LC 102. Thereafter, the LC-SC gate valve 510 and the TMP valve 520 are closed.

Subsequently, the gas is leaked into the LC 102. At this stage, from a state in which the inside of the LC 102 is in the high vacuum state, the leak pipe 400A with poor conductance and communicating with the LC 102 and the leak equipment (not shown), and the two leak valves 106 provided in the leak pipe 402, are opened at a slight time difference in the stated order, and the gas is leaked into the LC 102 through a porous filter 700. When the leak is performed in accordance with the capacity of the leak equipment, particularly when the vacuum at the start of the leak is broken, the pressure fluctuation speed and the airflow speed accompanying the pressure fluctuation speed increase, and the foreign matter is accidentally accumulated in the LC 102, the foreign matter may be wound up and adhere to the wafer 600, causing a problem. The reason for performing the above-described leak is that, at the start of the leak, by the leak with reduced flow rate from the leak pipe 400A with poor conductance, the pressure fluctuation speed within the LC 102 and the airflow speed accompanying the pressure fluctuation speed are reduced to prevent the foreign matter from being wound up, whereas if this continues, a time required to complete the leak increases, and therefore, by adding the leak from the leak pipe 400 with normal conductance from the middle, an increase in time is reduced. If the pressure fluctuation speed at which the vacuum is broken at the start of the leak is too small, the time required to complete the leak increases, and thus the speed is generally set as quickly as possible within a range that does not cause the foreign matter to be wound up. The porous filter 700 has a buffering function of alleviating a shock wave generated when the vacuum is broken by reducing the flow rate as described above. The shock wave may tear off the foreign matter adhered to an inner wall of the LC 102 and make it float. In that case, thereafter, the foreign matter will be blown away by the airflow generated inside the LC 102, and thus the shock wave needs to be reduced along with the pressure fluctuation speed.

Subsequently, the apparatus returns to the initial state. When the pressure gauge 103 detects that the internal pressure of the LC 102 reaches the atmospheric pressure due to the leak, the CD-SEM 100 returns to the initial state by closing the two leak valves 106.

Subsequently, the switching of the inspection contents according to the type of the wafer 600 will be described. There are various wafers 600, and the inspection contents are also various depending on the type. The CD-SEM 100 stores, in a storage unit 2100, a plurality of data files (hereinafter, referred to as "recipe files") defining inspection contents such as an inspection place of the wafer 600, a magnification at the time of inspection, and an acceleration voltage at the time of emitting an electron beam. The computer system 2000 can switch the inspection contents according to the wafer. By inputting in advance which recipe file is to be applied from a user interface of the input and output device 3000 according to the type of the wafer 600 to be inspected by an operator, the CD-SEM 100 can automatically switch the inspection contents.

Figure 3:
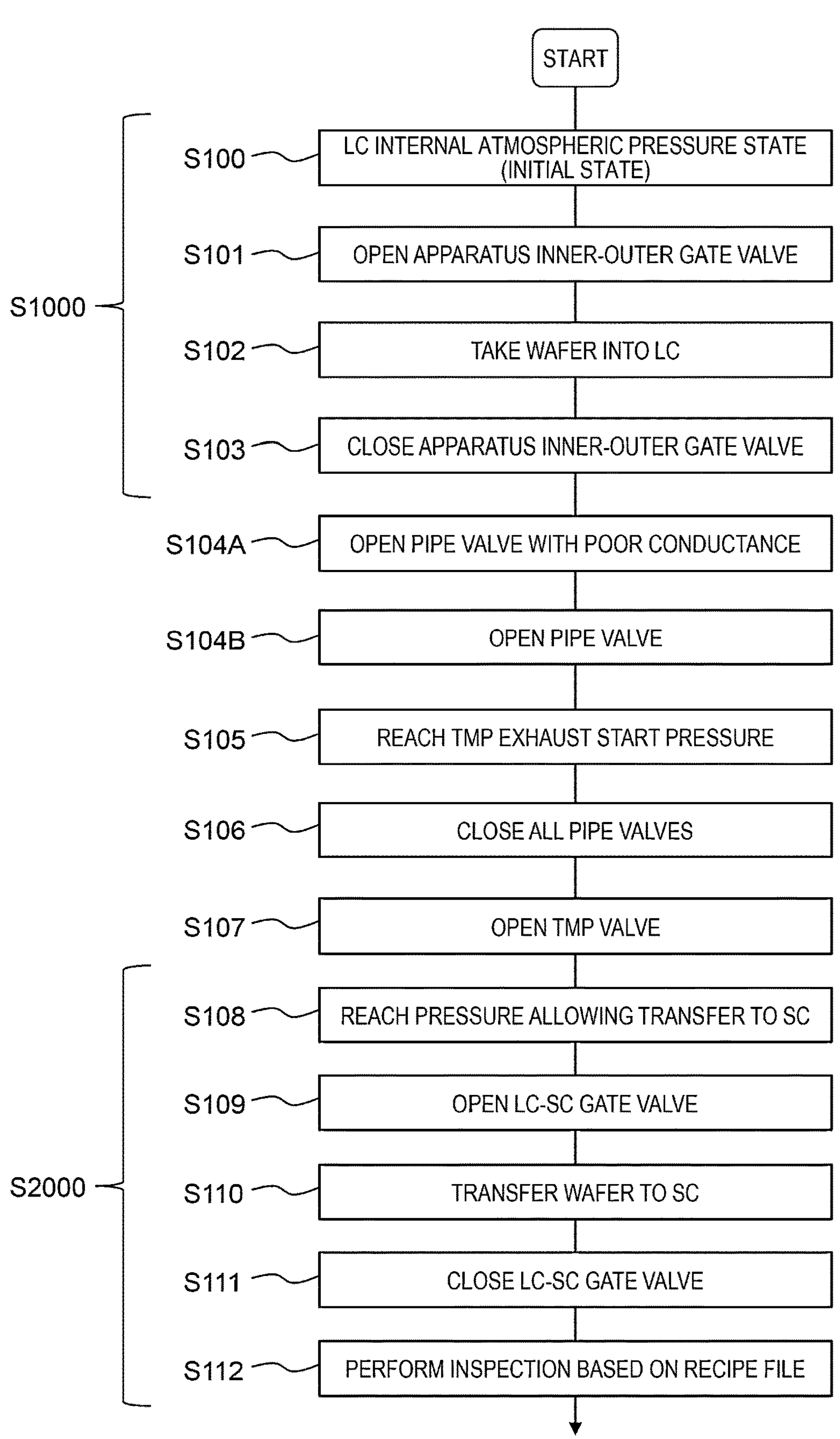
FIG. 3 is a flowchart showing an operation procedure until the general CD-SEM inspects a wafer 600.

FIG. 3 is a flowchart showing an operation procedure until the general CD-SEM inspects the wafer 600. The operation procedure is the same as the operation procedure described with reference to FIG. 2, and thus the details will be omitted. In FIG. 3, a common flow S1000 and a common flow S2000 are defined for convenience when a flowchart to be described later is cited.

Figure 4:
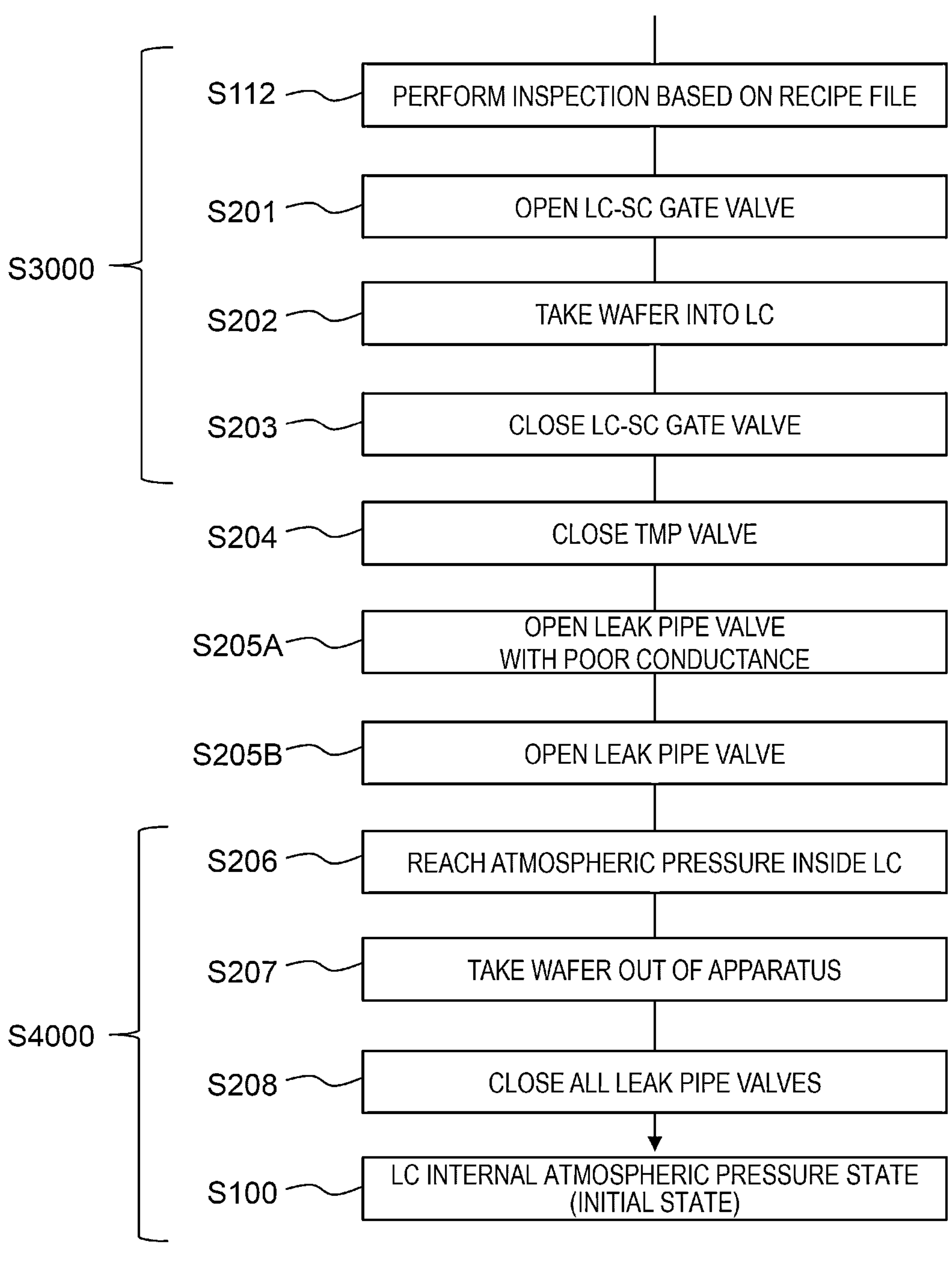
FIG. 4 is a flowchart showing an operation procedure until the general CD-SEM returns the LC to an initial state after inspection.

FIG. 4 is a flowchart showing an operation procedure until the general CD-SEM returns the LC to the initial state after the inspection. The operation procedure is the same as the operation procedure described with reference to FIG. 2, and thus the details will be omitted. In FIG. 4, a common flow S3000 and a common flow S4000 are defined for convenience when a flowchart to be described later is cited.

Figure 5:
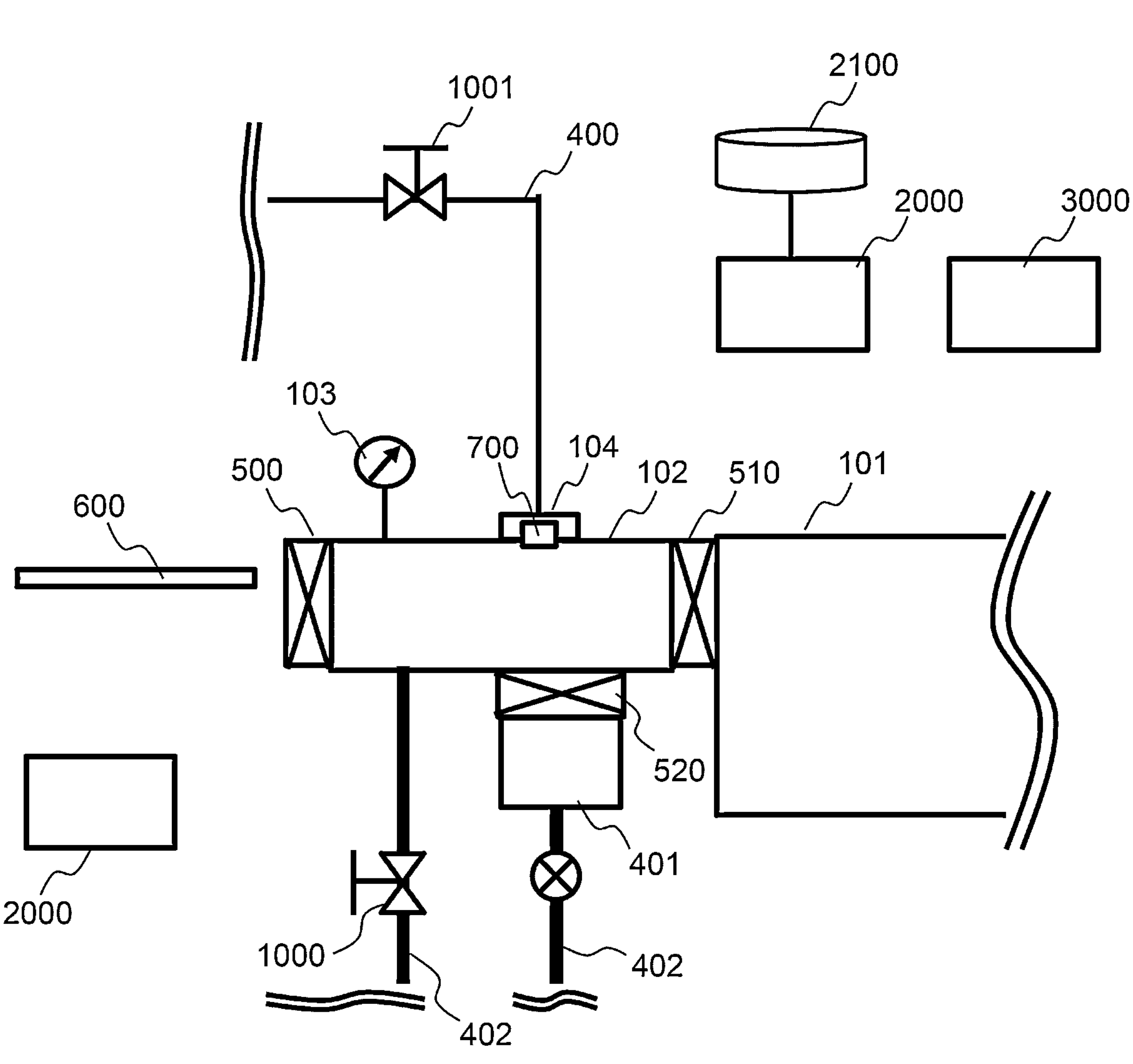
FIG. 5 shows a configuration of a system for performing vacuum exhaust and leak of an LC 101 in Embodiment 1.

FIG. 5 shows a configuration of a system for performing the vacuum exhaust and the leak of the LC 102 in Embodiment 1. The vacuum processing apparatus according to Embodiment 1 includes (a) a variable leak valve (variac valve) 1001 in the middle of the pipe 400 communicating with the LC 102 and the dry pump (not shown), which enables control of the flow rate of the gas by changing conductance, and (b) a conductance valve 1000 in the middle of the leak pipe 402 communicating with the LC 102 and the leak equipment (not shown), which enables coarse evacuation while controlling an amount of exhaust gas by changing the conductance. The conductance valve 1000 and the variable leak valve 1001 (conductance variable device) are, for example, devices that can set a desired pressure fluctuation speed by the user interface of the input and output device 3000 and can freely control the pressure fluctuation speed of the LC 102 during the coarse evacuation and the leak based on feedback control using a detection value of the pressure gauge 103 so as to obtain a set value. These valves are controlled by the computer system 2000.

Next, a method for automatically switching the pressure fluctuation speed according to the type of the wafer 600 will be described. Since a pattern formation process is the same for the wafers 600 of the same type, not only are shapes of the patterns the same, such as a width and a height, but also trends such as an amount of outgas emitted from the wafer 600 and a strength of the patterns are similar.

In the related art, the CD-SEM 100 can automatically switch the inspection contents when the type of the wafer 600 is changed, by setting the inspection contents according to the type of the wafer 600 to the computer system 2000 via the input and output device 3000 in advance. In addition to the above, by setting the pressure fluctuation speed within the LC 102 according to the type of wafer 600, the vacuum processing apparatus according to Embodiment 1 can automatically switch the pressure fluctuation speed, such as a normal pressure fluctuation speed for a normal pattern and a smaller pressure fluctuation speed for a fragile pattern.

Figure 6:
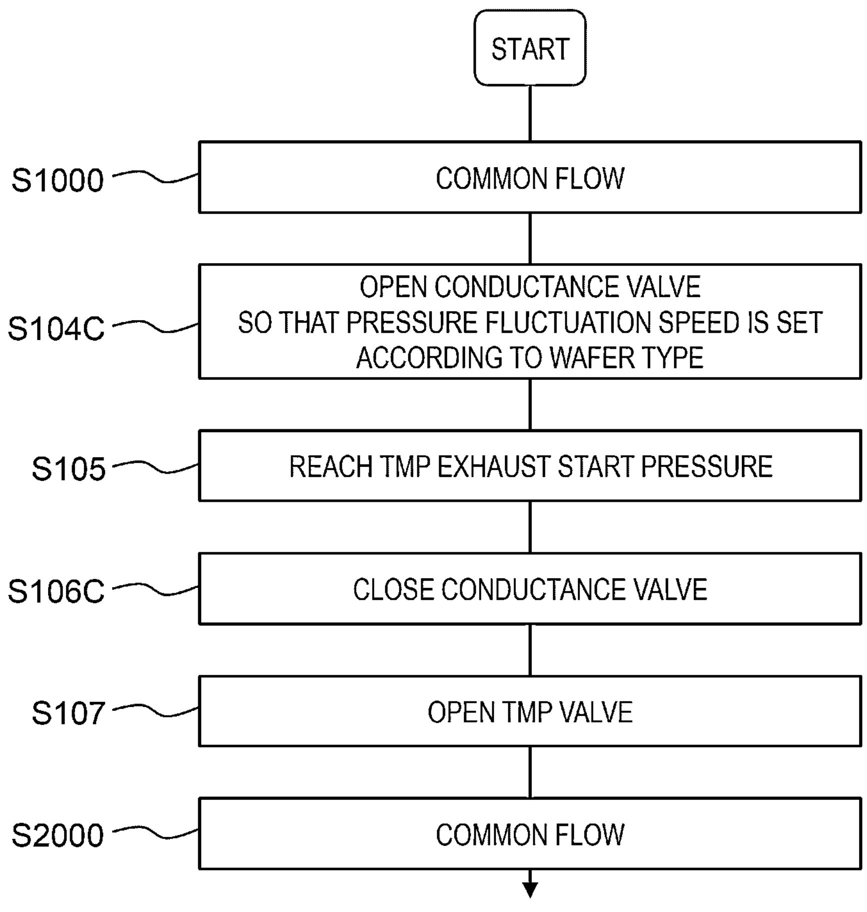
FIG. 6 is a flowchart showing an operation procedure until the vacuum processing apparatus according to Embodiment 1 inspects the wafer 600.

FIG. 6 is a flowchart showing an operation procedure until the vacuum processing apparatus according to Embodiment 1 inspects the wafer 600. The difference from FIG. 3 is that S104C is performed instead of S104A and S104B, and S106C is performed instead of S106. The common flows S1000 and S2000 are the same as those in FIG. 3. The operation procedure of FIG. 6 is the same as the operation procedure described with reference to FIG. 5, and thus the details thereof will be omitted.

Figure 7:
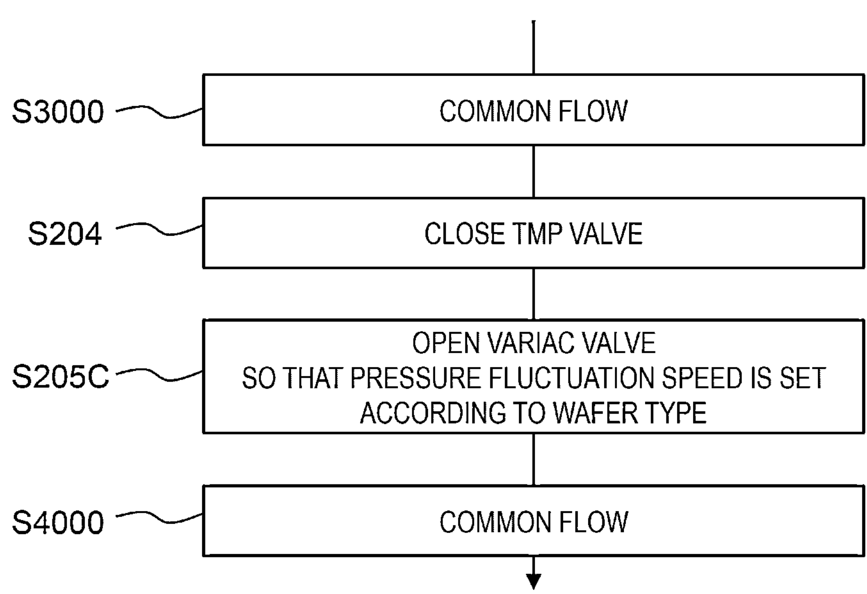
FIG. 7 is a flowchart showing an operation procedure until the vacuum processing apparatus according to Embodiment 1 returns the LC to the initial state after the inspection.

FIG. 7 is a flowchart showing an operation procedure until the vacuum processing apparatus according to Embodiment 1 returns the LC to the initial state after the inspection. The difference from FIG. 4 is that S205C is performed instead of S205A and S205B. The common flow S3000 and S4000 are the same as those in FIG. 4. The operation procedure of FIG. 7 is the same as the operation procedure described with reference to FIG. 5, and thus the details thereof will be omitted.

Figure 8:
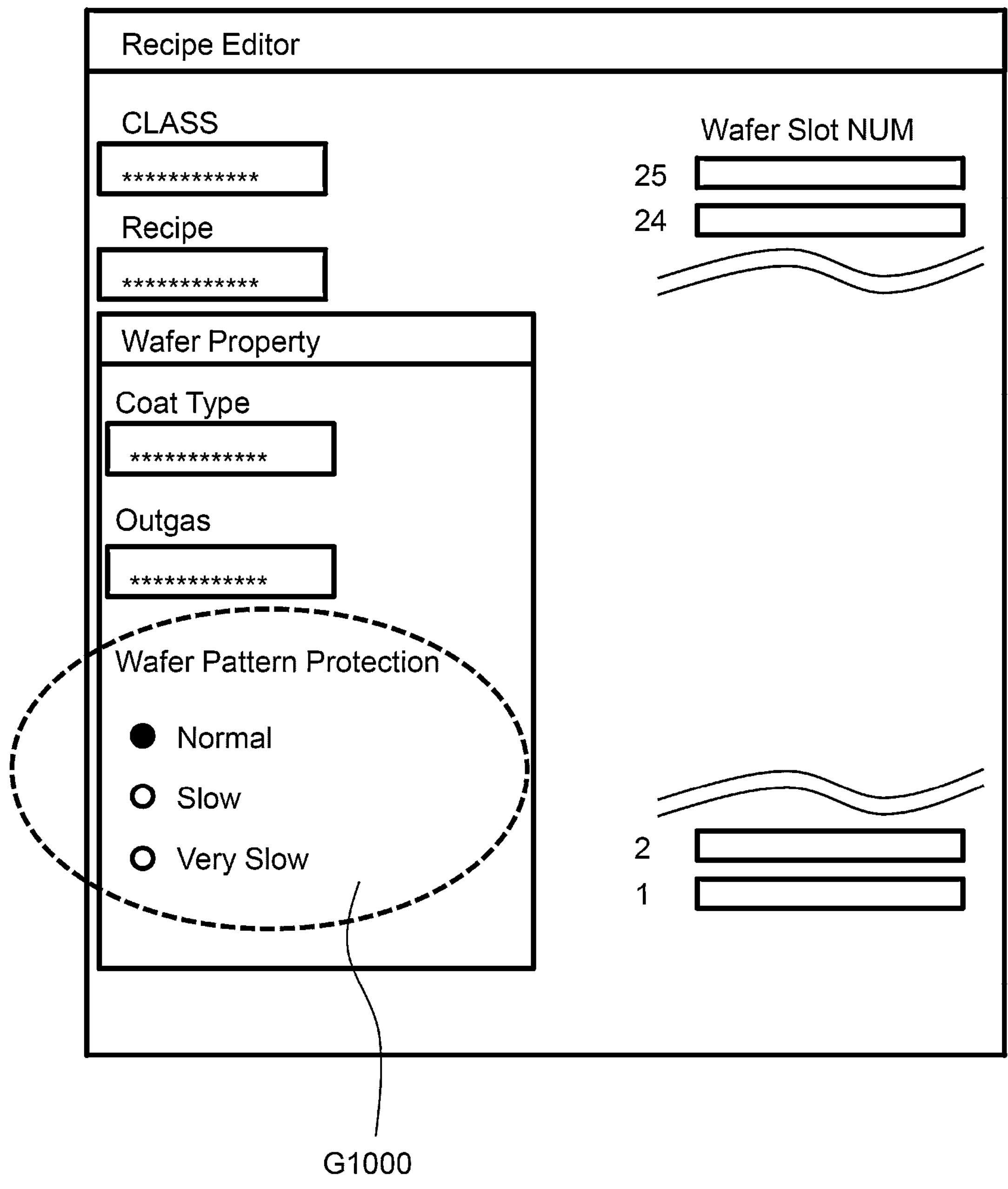
FIG. 8 shows a screen example of a user interface provided by a computer system 2000 in Embodiment 1.

FIG. 8 shows a screen example of a user interface provided by the computer system 2000 in Embodiment 1. For example, when the pressure fluctuation speed is switched in three stages according to the type of the wafer 600, a user selects any one of radio buttons of Normal, Slow, and Very Slow in a column surrounded by a broken line G1000. According to the selection, the computer system 2000 implements the pressure fluctuation speed in the designated LC 102 by controlling an opening and closing timing, an opening and closing number, an opening and closing amount, an opening and closing order, and the like of each of the conductance valve 1000 and the variable leak valve 1001.

Embodiment 2

Figure 9:
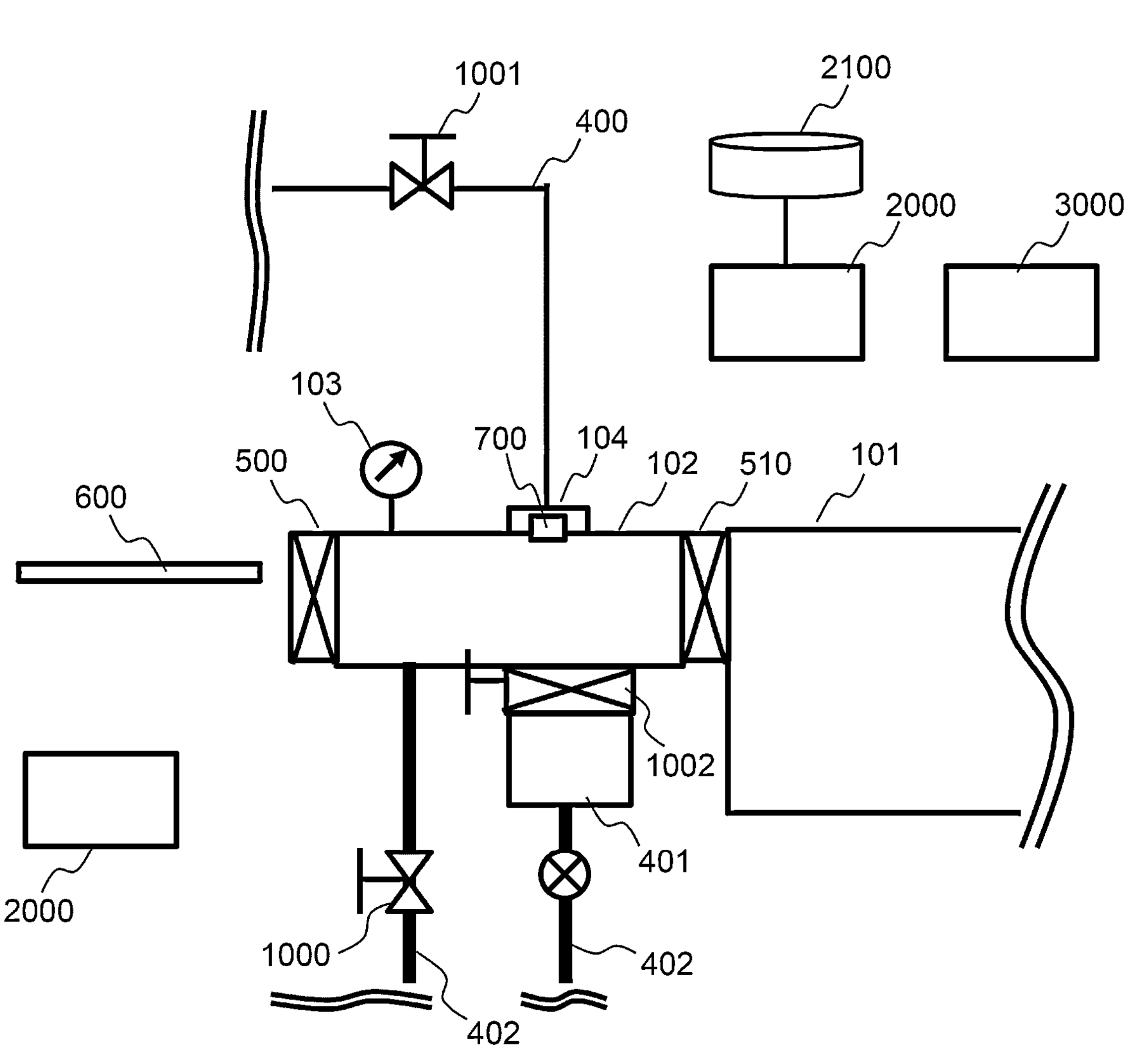
FIG. 9 is a schematic view of a system for performing vacuum exhaust and leak of the LC 102 in a vacuum processing apparatus according to Embodiment 2.

FIG. 9 is a schematic view of a system for performing vacuum exhaust and leak of the LC 102 in a vacuum processing apparatus according to Embodiment 2 of the present disclosure. A structural difference from Embodiment 1 is that the TMP valve 520 adjacent to an intake port of the TMP 401 is replaced with a TMP conductance valve 1002.

In Embodiment 1, when the pressure fluctuation speed at the start of the coarse evacuation and the leak is made fairly small, the pressure fluctuation speed immediately after opening the TMP valve 520 and starting the regular evacuation becomes relatively large. In the case of the wafer 600 in which the pattern is extremely fragile, the wafer may be broken even at the pressure fluctuation speed immediately after the start of the regular evacuation. However, it is difficult to deal with such breakage in Embodiment 1.

In Embodiment 2, the computer system 2000 also switches the pressure fluctuation speed of the TMP conductance valve 1002 that performs the regular evacuation according to the type of the wafer 600 to be inspected. Accordingly, even when the pattern of the wafer 600 is extremely fragile, the breakage can be prevented.

Figure 10:
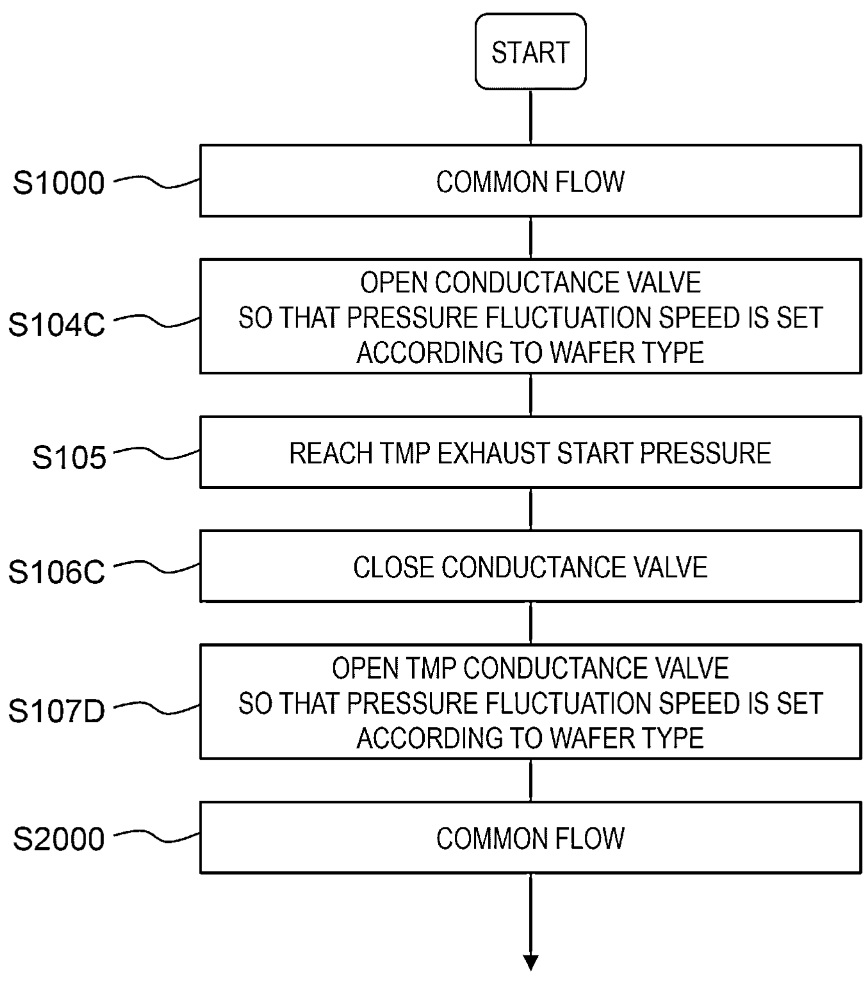
FIG. 10 is a flowchart showing an operation procedure until the vacuum processing apparatus according to Embodiment 2 inspects the wafer 600.

FIG. 10 is a flowchart showing an operation procedure until the vacuum processing apparatus according to Embodiment 2 inspects the wafer 600. The difference from FIG. 6 is that S107D is performed instead of S107. The operation procedure of FIG. 10 is the same as the operation procedure described with reference to FIG. 9, and thus the details thereof will be omitted.

Figure 11:
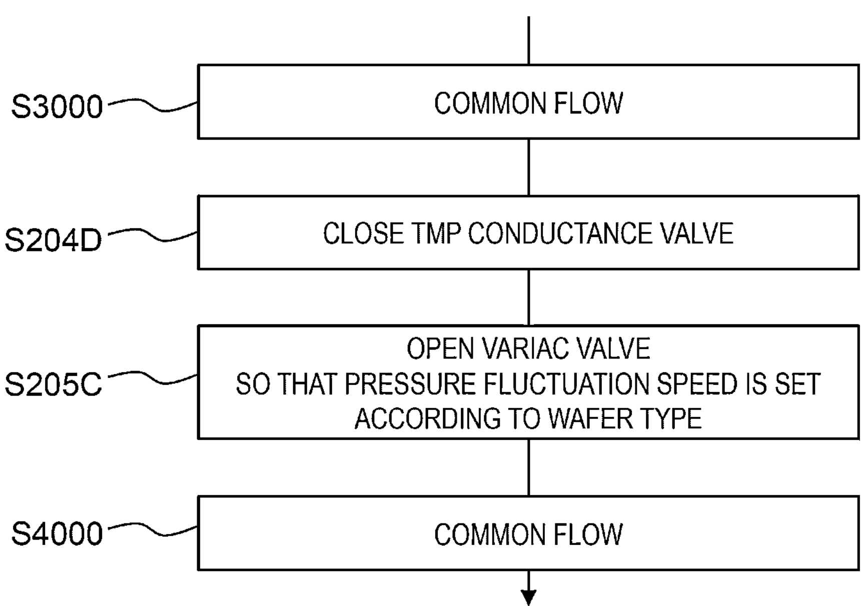
FIG. 11 is a flowchart showing an operation procedure until the vacuum processing apparatus according to Embodiment 2 returns the LC to the initial state after the inspection.

FIG. 11 is a flowchart showing an operation procedure until the vacuum processing apparatus according to Embodiment 2 returns the LC to the initial state after the inspection. The difference from FIG. 7 is that S204D is performed instead of S204. The operation procedure of FIG. 11 is the same as the operation procedure described with reference to FIG. 9, and thus the details thereof will be omitted.

Embodiment 3

Figure 12:
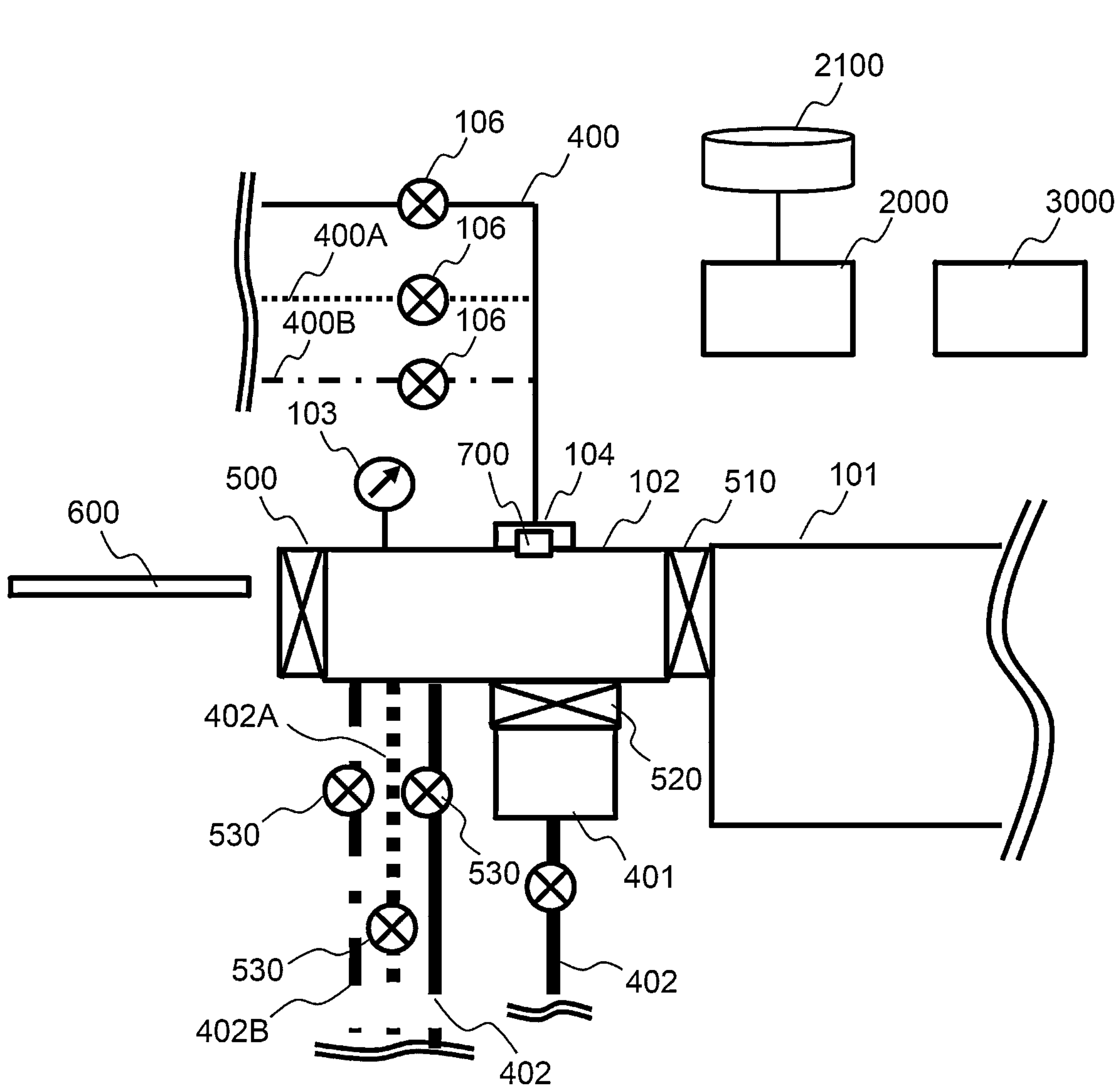
FIG. 12 is a schematic view of a system for performing vacuum exhaust and leak of the LC 102 in a vacuum processing apparatus according to Embodiment 3.

FIG. 12 is a schematic view of a system for performing vacuum exhaust and leak of the LC 102 in a vacuum processing apparatus according to Embodiment 3 of the present disclosure. Since the system using the conductance valve 1000 and the variac valve 1001 is generally expensive, a configuration example in Embodiment 3 that does not use these valves will be described.

Structural differences between Embodiment 3 and Embodiment 1 are that (a) instead of the pipe 402 and the conductance valve 1000, provided are a pipe 402B with very poor conductance, the pipe 402A with poor conductance, the pipe 402, and a total of three pipe valves 530 (conductance variable devices) with one each disposed in the middle of each pipe, and (b) instead of the leak pipe 400 and the variac valve 1001 connected to the leak device 104, provided are a leak pipe 400B with very poor conductance, the leak pipe 400A with poor conductance, and the leak pipe 400 that are converged to be connected to the leak device 104, and a total of three leak valves 106 (conductance variable devices) with one each disposed in the middle of each pipe.

A method for changing the pressure fluctuation speed of the coarse evacuation according to Embodiment 3 will be described. In the case of the wafer 600 in which the pattern is fragile, the pipe 402B with very poor conductance, the pipe 402A with poor conductance, the pipe 402, which communicate the LC 102 with the dry pump (not shown), and the three pipe valves 530 provided on the respective pipes are opened with a slight time difference in the stated order. Accordingly, it is possible to reduce the pressure fluctuation speed immediately after the start of the coarse evacuation to a level at which the pattern is not broken.

In the case of a normal pattern, the pipe valve 530 provided in the pipe 402B with very poor conductance is not opened, and the pipe 402A with poor conductance, the pipe 402, and the two pipe valves 106 provided in the respective pipes are opened with a slight time difference in the stated order. Accordingly, the fluctuation speed of the LC internal pressure immediately after the start of the coarse evacuation and the airflow speed accompanying the fluctuation speed can be changed to such an extent that the foreign matter is not wound up.

That is, the computer system 2000 controls the opening and closing timing, the opening and closing number, the opening and closing amount, the opening and closing order, and the like of each of the pipe valves 530 and 106 according to the fragility of the pattern on the wafer 600, thereby adjusting the pressure fluctuation speed within the LC 102 so as not to break the pattern or wind up the foreign matter.

Although the method for changing the pressure fluctuation speed of the coarse evacuation is described above, the method for changing the leak is the same, and thus the description of the method for changing the leak will be omitted. In addition, a method for setting automatic switching according to the type of the wafer 600 for both the coarse evacuation and the leak is the same as in Embodiment 1, and thus the description will be omitted. According to Embodiment 2, the conductance of the vacuum exhaust pipes (pipes including 402, 402A, and 402B) and the conductance of the leak pipes (pipes including the leak pipes 400, 400A, and 400B) can be changed according to the fragility of the pattern on the wafer 600.

A pipe configuration shown in FIG. 12 is merely an example. For example, although the pipe 402B with very poor conductance, the pipe 402A with poor conductance, and the pipe 402 are each communicated with the LC 102, two or three of these may be converged and communicated with the LC 102. The conductance may be adjusted by providing an orifice or the like in the pipe. In addition, although three pipes, that is, the leak pipe 400B with very poor conductance, the leak pipe 400A with poor conductance, and the leak pipe 400 are converged and connected to the leak device 104 provided with the porous filter 700 in order to alleviate the shock wave, a convergence state of the leak pipe may be changed by increasing the number of the leak devices 104. The conductance may be adjusted by a needle valve or the like provided in the leak pipe.

Figure 13:
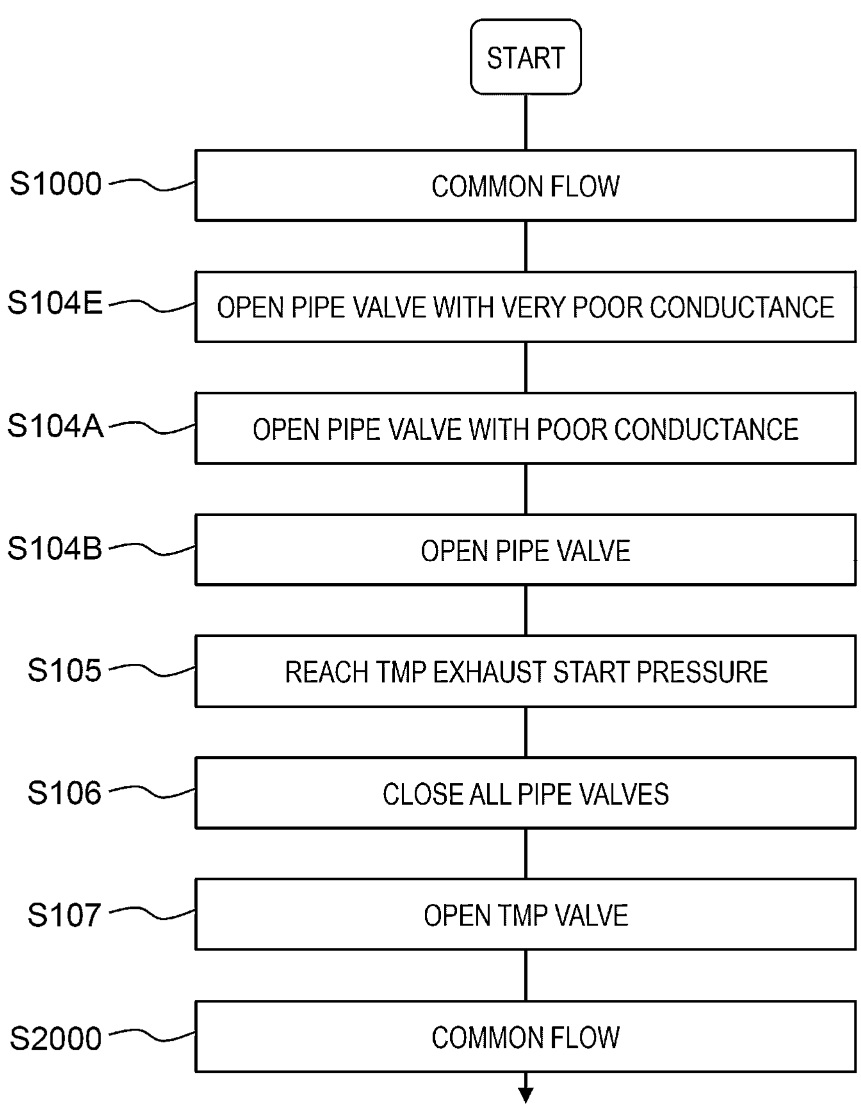
FIG. 13 is a flowchart showing an operation procedure until the vacuum processing apparatus according to Embodiment 3 inspects the wafer 600 with a fragile pattern.

FIG. 13 is a flowchart showing an operation procedure until the vacuum processing apparatus according to Embodiment 3 inspects the wafer 600 with the fragile pattern. The difference from FIG. 3 is that S104E is performed before S104A. The operation procedure of FIG. 13 is the same as the operation procedure described with reference to FIG. 12, and thus the details thereof will be omitted. When the normal wafer 600 is inspected, an operation procedure same as that performed by the CD-SEM in the related art is performed.

Figure 14:
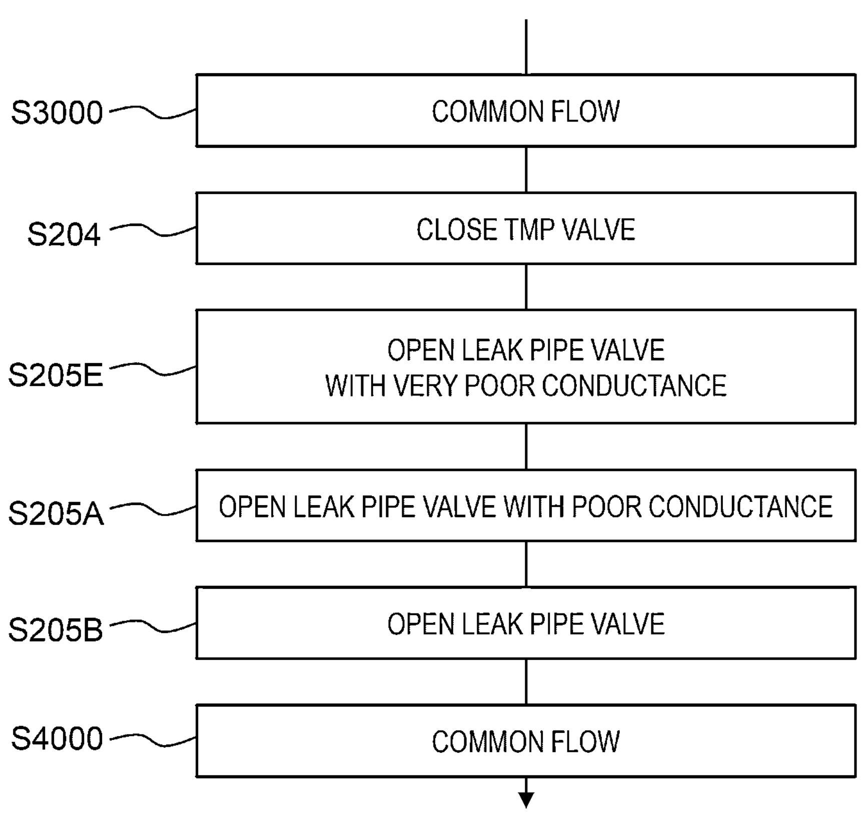
FIG. 14 is a flowchart showing an operation procedure until the vacuum processing apparatus according to Embodiment 3 returns the LC to the initial state after the inspection of the wafer 600 with the fragile pattern.

FIG. 14 is a flowchart showing an operation procedure until the vacuum processing apparatus according to Embodiment 3 returns the LC to the initial state after the inspection of the wafer 600 with the fragile pattern. The difference from FIG. 4 is that S205E is performed before S205A. The operation procedure of FIG. 14 is the same as the operation procedure described with reference to FIG. 12, and thus the details thereof will be omitted. When the normal wafer 600 is inspected, an operation procedure same as that performed by the CD-SEM in the related art is performed.

Embodiment 4

There are foreign matters attached to the wafer 600, and as the wafer 600 is taken in, a new foreign matter may be taken into the LC 102. When characteristics of the taken-in foreign matter are such that the taken-in foreign matter is more likely to be wound up than the foreign matter originally contained in the LC 102, a state of the apparatus changes. In Embodiment 1, although the pressure fluctuation speed can be switched according to the type of the wafer 600, it is difficult to deal with the case in which, due to such a change in the state of the apparatus, the pressure fluctuation speed that can prevent the foreign matter from wound up is smaller than the speed that can prevent pattern breakage. Therefore, in Embodiment 4 according to the present disclosure, a configuration example will be described in which the pressure fluctuation speed within the LC 102 is changed according to the type and an amount of foreign matters taken into the LC 102.

Figure 15:
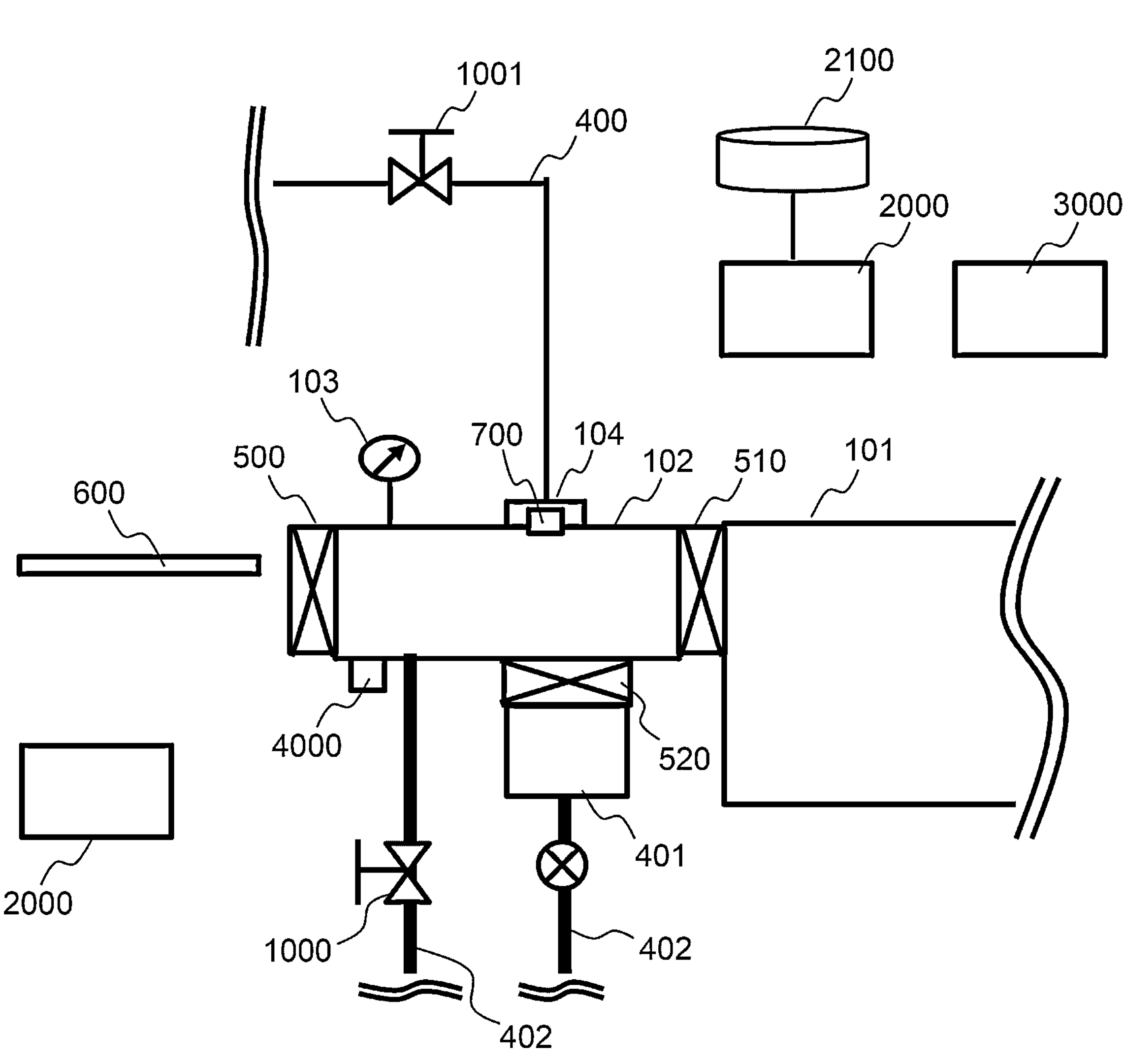
FIG. 15 is a schematic view of a system for performing vacuum exhaust and leak of the LC 102 in a vacuum processing apparatus according to Embodiment 4.

FIG. 15 is a schematic view of a system for performing the vacuum exhaust and the leak of the LC 102 in a vacuum processing apparatus according to Embodiment 4. In Embodiment 4, similarly to Embodiment 1, the pressure fluctuation speed at which the pattern breakage can be prevented is set in the computer system 2000 via the input and output device 3000 according to the type of the wafer 600 to be inspected. Further, by setting a threshold of an amount of foreign matters to the computer system 2000 via the input and output device 3000, it is possible to determine which of the pattern breakage and the wind-up of the foreign matter is more likely to occur in the computer system 2000, and to automatically switch to the pressure fluctuation speed at which both cases can be prevented.

The vacuum processing apparatus according to Embodiment 4 includes a foreign matter monitor 4000 capable of detecting the number of foreign matters inside the LC 102. The threshold of the amount of foreign matters is set in the computer system 2000 via the input and output device 3000, and the pressure fluctuation speed within the LC 102 can be adjusted so that the number of foreign matters wound up does not exceed the threshold at an off-line timing at which the wafer 600 is not inspected. The foreign matter monitor 4000 can be implemented by, for example, a device that counts particles other than the wafer 600 as a foreign matter by emitting light to the inside of the LC 102 and detecting reflected light reflected from the foreign matter.

According to the amount of foreign matters (the number of foreign matters) scattered in the LC 102 detected by the foreign matter monitor 4000, the computer system 2000 identifies the pressure fluctuation speed within the LC 102 so that the amount of foreign matters being wound up within the LC 102 is less than a reference value. A relational expression between the pressure fluctuation speed and the amount of foreign matters may be stored in advance. The computer system 2000 further identifies the pressure fluctuation speed within the LC 102 in which an amount of pattern breakage on the wafer 600 is less than a reference value. A relational expression between the pressure fluctuation speed and the amount of pattern breakage may be stored in advance. The computer system 2000 controls the conductance of each pipe such that the smaller of these pressure fluctuation speeds is generated within the LC 102.

Figure 16:
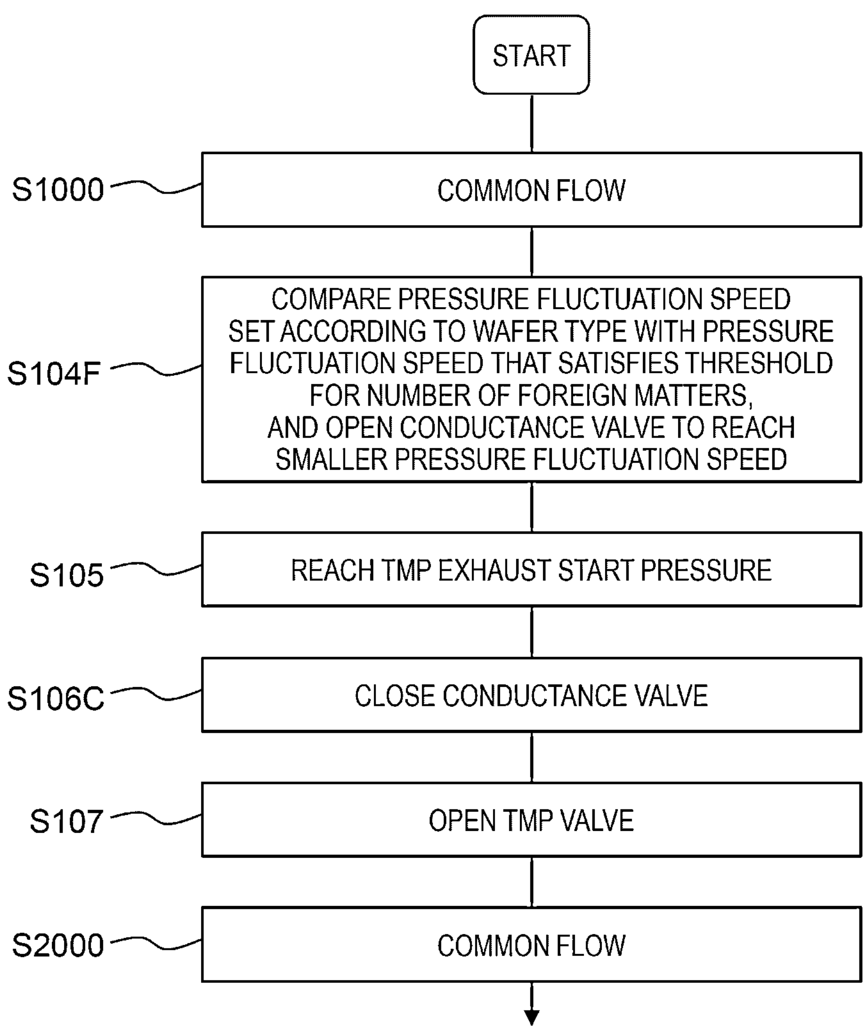
FIG. 16 is a flowchart showing an operation procedure until the vacuum processing apparatus according to Embodiment 4 inspects the wafer 600.

FIG. 16 is a flowchart showing an operation procedure until the vacuum processing apparatus according to Embodiment 4 inspects the wafer 600. The difference from Embodiment 1 is that S104F is performed instead of S104C. The operation procedure of FIG. 16 is the same as the operation procedure described with reference to FIG. 15, and thus the details thereof will be omitted.

Figure 17:
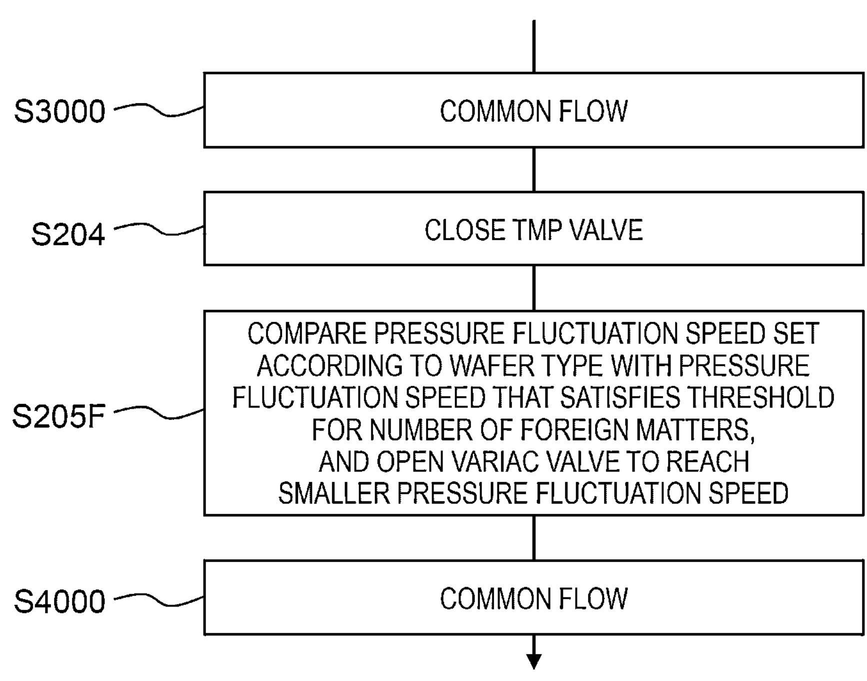
FIG. 17 is a flowchart showing an operation procedure until the vacuum processing apparatus according to Embodiment 4 returns the LC to the initial state after the inspection.

FIG. 17 is a flowchart showing an operation procedure until the vacuum processing apparatus according to Embodiment 4 returns the LC to the initial state after the inspection. The difference from Embodiment 1 is that S205F is performed instead of S205C. The operation procedure of FIG. 17 is the same as the operation procedure described with reference to FIG. 15, and thus the details thereof will be omitted.

Figure 18:
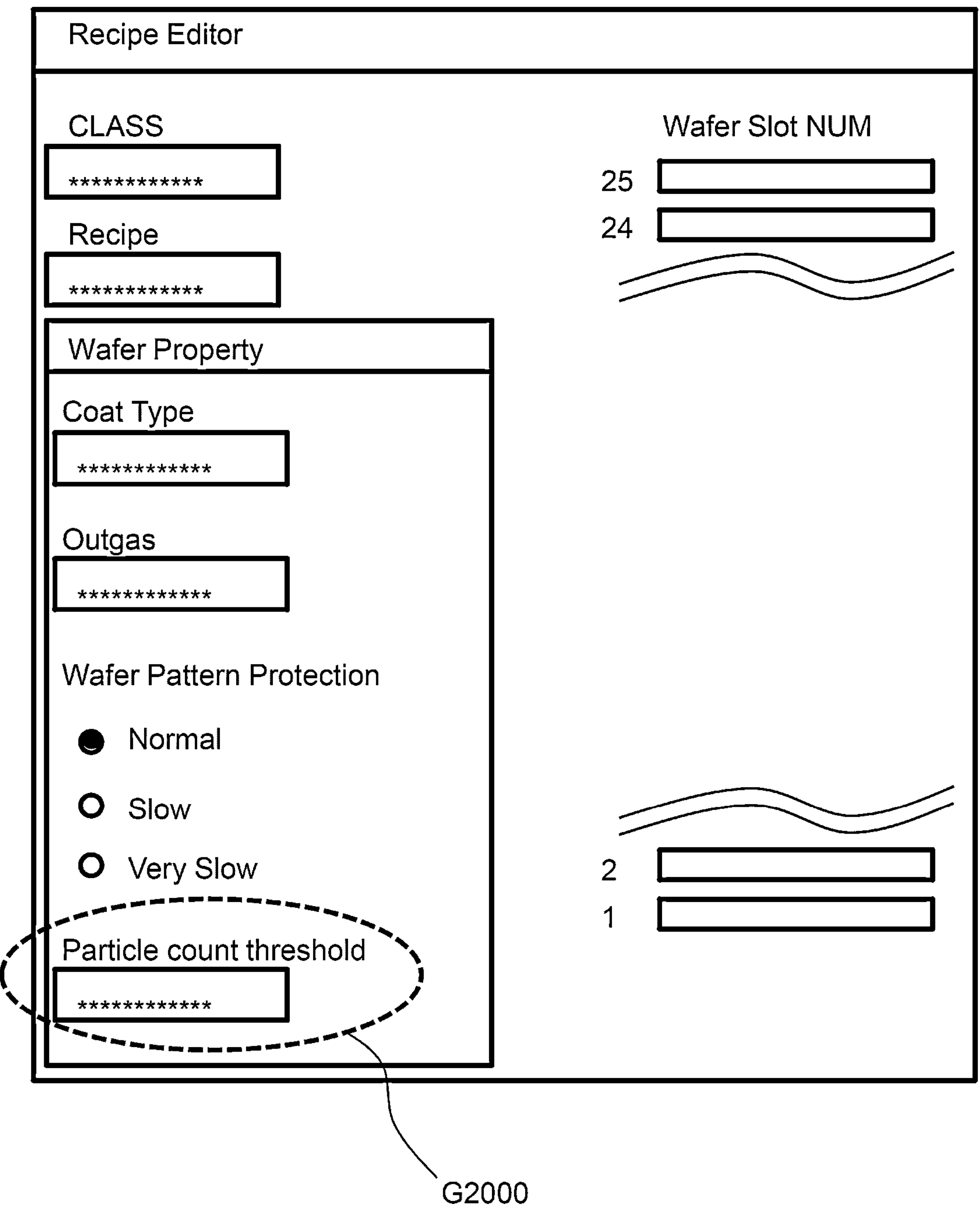
FIG. 18 shows a screen example of a user interface provided by the computer system 2000 in Embodiment 4.

FIG. 18 shows a screen example of a user interface provided by the computer system 2000 in Embodiment 4. FIG. 18 includes a column surrounded by G2000 in addition to the screen example described in Embodiment 1. The user inputs a threshold of the number of foreign matters in the same column. The computer system 2000 receives the threshold. The computer system 2000 identifies in advance, according to the threshold, the pressure fluctuation speed at which the number of foreign matters within the LC 102 is less than the threshold. For example, a correspondence relationship between the threshold and the pressure fluctuation speed may be defined in advance. In S104F, the computer system 2000 controls each valve to achieve the smaller of the pressure fluctuation speed corresponding to the type of wafer 600 and the pressure fluctuation speed that satisfies the threshold of the number of foreign matters. Accordingly, according to which of the pattern breakage and the wind-up of the foreign matter is more likely to occur, it is possible to prevent the pattern breakage and also to prevent the foreign matter from being wound up.

Regarding Modification of Present Disclosure

The present disclosure is not limited to the embodiments described above, and includes various modifications. For example, the embodiments described above are described in detail to facilitate understanding of the present disclosure, and it is not necessary to include all of the configurations described. A part of one embodiment can be replaced with a configuration of another embodiment. A configuration of another embodiment can be added to a configuration of one embodiment. A part of a configuration of each embodiment may be deleted, added with a part of a configuration of another embodiment, or replaced with a part of a configuration of another embodiment.

In the above embodiments, the pressure fluctuation speed in the LC 102 is not necessarily limited to three stages exemplified by a GUI of FIG. 8. The feedback control of the pressure fluctuation speed is described as an example, and the present disclosure is not limited thereto. The user interface described with reference to FIG. 8 or FIG. 18 is an example, and the present disclosure is not limited thereto.

In the above embodiments, a configuration example is described in which a mechanism for changing the conductance is disposed on both the pipes (402, 402A, 402B) for the vacuum exhaust and the pipes (400, 400A, 400B) for the leak. Since an effect on the pattern of the wafer 600 is large during vacuum exhaust, it is additionally described that the purpose of the present disclosure can be achieved as long as the conductance of at least the pipes for vacuum exhaust can be changed.

In the above embodiments, an example is described in which the vacuum processing apparatus according to the present disclosure is applied to the CD-SEM 100 and the wafer 600, and an application target of the present disclosure is not limited to the CD-SEM 100. For example, the vacuum processing apparatus according to the present disclosure can be applied to general vacuum processing apparatuses such as bright field micromirrors, spectroscopic analysis apparatuses, optical measurement apparatuses, optical inspection apparatuses, and general optical equipment and optical devices.

In the above embodiments, the CD-SEM 100 and the vacuum processing apparatus are described as being integrated, and the two components may be implemented as separate apparatuses. Further, the apparatus for controlling the CD-SEM 100 and the apparatus for controlling the vacuum processing apparatus may be integrated with the computer system 2000 as in the above embodiments, or the apparatuses may be implemented as separate control apparatuses.

In the above embodiments, three parameters in G1000 in FIG. 8 are shown as examples of parameters corresponding to the fragility of a shape pattern formed on a sample. The parameters that can be identified as parameters corresponding to the fragility are not limited thereto, and any parameter may be used as long as the computer system 2000 can change the conductance of each pipe according to the ease of breakage of the pattern. For example, a type of a sample, a type of a shape pattern formed on the sample, a manufacturing condition for the sample or the pattern formed on the sample, a numerical value indicating physical and chemical characteristics of the sample, and a numerical value indicating physical and chemical characteristics of the pattern can be considered. Other similar parameters may also be used. Further, in the embodiments in which the vacuum processing apparatus handles a sample accommodated in a sample storage container and processes the sample, a type and an identification signal of the sample storage container can be designated as the parameters corresponding to the fragility. Further, in the embodiments in which a sample processed by the vacuum processing apparatus is managed according to a time point or a time zone, the time point or the time zone may be associated with the parameters corresponding to the fragility. Further, the vacuum processing apparatus may receive the parameter corresponding to the above-described fragility from another apparatus or an external system and change the conductance of each pipe. Further, the parameter itself is not necessarily provided from the outside of the computer system 2000, and the computer system 2000 may acquire the parameter according to several criteria. For example, the computer system 2000 may store in advance a correspondence relationship between the type of the sample and the ease of breakage of the pattern, and the computer system 2000 may identify the ease of breakage of the pattern by providing the type of the sample to the computer system 2000. Other suitable methods may also be used.

REFERENCE SIGNS LIST

100: CD-SEM
101: SC

102: LC
103: pressure gauge
104: leak device
105: broken line
106: leak valve
200: multiaxial stage
201: holding mechanism
300: electron optical system
400: leak pipe
400A: leak pipe with poor conductance
400B: leak pipe with very poor conductance
401: TMP
402: pipe
402A: pipe with poor conductance
402B: pipe with very poor conductance
500: apparatus inner-outer gate valve
510: LC-SC gate valve
520: TMP valve
530: pipe valve
600: wafer
700: porous filter
1000: conductance valve
1001: variac valve
1002: TMP conductance valve
2000: computer system
3000: input and output device
4000: foreign matter monitor

The invention claimed is:

1. A vacuum processing apparatus comprising:

a sample chamber configured to accommodate a sample;

a preliminary exhaust chamber configured to temporarily hold the sample when the sample is transferred between the sample chamber and outside air;

a pipe configured to transfer a gas between an inside of the preliminary exhaust chamber and the outside air;

a conductance variable device configured to change a conductance of the pipe; and a computer system configured to control the conductance variable device, wherein the computer system acquires a parameter corresponding to fragility of a shape pattern formed on the sample, when the fragility corresponding to the parameter is first fragility, the computer system controls the conductance variable device such that the conductance of the pipe is a first conductance, and when the fragility corresponding to the parameter is second fragility which is weaker than the first fragility, the computer system controls the conductance variable device such that the conductance of the pipe is a second conductance lower than the first conductance.

2. The vacuum processing apparatus according to claim 1, wherein the conductance variable device includes a conductance valve that changes the conductance of the pipe by changing a flow rate of the gas flowing through the pipe, and the computer system controls a flow rate of the gas passing through the conductance valve according to the fragility corresponding to the parameter, thereby changing the conductance of the pipe according to the fragility corresponding to the parameter.

3. The vacuum processing apparatus according to claim 1, wherein the pipe includes an exhaust pipe that exhausts a gas from the preliminary exhaust chamber and an introduction pipe that introduces the gas into the preliminary exhaust chamber, and the preliminary exhaust chamber and the introduction pipe are connected via a filter that alleviates a shock wave generated when the preliminary exhaust chamber and the introduction pipe are conducted.

4. The vacuum processing apparatus according to claim 1, wherein the pipe includes a first exhaust pipe connected to a first pump that exhausts a gas until the preliminary exhaust chamber is at a first vacuum degree and a second exhaust pipe connected to a second pump that exhausts the gas until the preliminary exhaust chamber is at a second vacuum degree higher than the first vacuum degree, and the second exhaust pipe and the preliminary exhaust chamber are connected via an exhaust conductance valve that changes a conductance of the second exhaust pipe by changing a flow rate of the gas passing through the second exhaust pipe.

5. The vacuum processing apparatus according to claim 1, wherein the pipe includes a first pipe with a first conductance, a second pipe with a second conductance higher than the first conductance, and a third pipe with a third conductance higher than the second conductance, the conductance variable device includes a valve that allows the first pipe, the second pipe, and the third pipe to be individually opened and closed, and the computer system controls at least one of an opening and closing number, an opening and closing amount, and an opening and closing order of each of the first pipe, the second pipe, and the third pipe according to the fragility corresponding to the parameter, thereby changing the conductance of the pipe according to the fragility corresponding to the parameter.

6. The vacuum processing apparatus according to claim 1, further comprising:

a foreign matter monitor configured to detect a foreign matter present inside the preliminary exhaust chamber, wherein the computer system determines, according to an amount of the foreign matter detected by the foreign matter monitor, likelihood of occurrence of wind-up of the foreign matter inside the preliminary exhaust chamber and breakage of the shape pattern, and the computer system controls, according to a determination result, the conductance variable device to obtain the conductance with which prevention of the wind-up of the foreign matter and the breakage of the shape pattern is allowed.

7. The vacuum processing apparatus according to claim 6, wherein the computer system identifies a first pressure fluctuation speed in the preliminary exhaust chamber at which a wind-up amount of the foreign matter is less than a reference value based on the amount of the foreign matter detected by the foreign matter monitor, the computer system identifies a second pressure fluctuation speed in the preliminary exhaust chamber at which a breakage amount of the shape pattern is less than a reference value, and the computer system controls the conductance variable device to obtain the conductance with which a smaller one of the first pressure fluctuation speed and the second pressure fluctuation speed is achieved.

8. The vacuum processing apparatus according to claim 6, further comprising:

a user interface configured to receive a user input designating a threshold related to the foreign matter, wherein the computer system controls the conductance variable device to obtain the conductance with which the foreign matter is not wound up inside the preliminary exhaust chamber in an amount greater than the threshold designated by the user input.

9. The vacuum processing apparatus according to claim 1, further comprising:

a user interface configured to receive a user input designating the parameter, wherein the computer system controls the conductance variable device according to the user input.

10. The vacuum processing apparatus according to claim 1, wherein the parameter includes at least one of a type of the sample, a type of the shape pattern, a numerical value indicating a characteristic of the sample, and a numerical value indicating a characteristic of the shape pattern.

* * * * *